United States Patent
Song

(10) Patent No.: US 7,675,798 B2
(45) Date of Patent: Mar. 9, 2010

(54) SENSE AMPLIFIER CONTROL CIRCUIT AND SEMICONDUCTOR DEVICE USING THE SAME

(75) Inventor: Woo Seok Song, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 125 days.

(21) Appl. No.: 11/648,321

(22) Filed: Dec. 29, 2006

(65) Prior Publication Data

US 2007/0195624 A1   Aug. 23, 2007

(30) Foreign Application Priority Data

Feb. 20, 2006   (KR) ...................... 10-2006-0016436

(51) Int. Cl.
*G11C 7/00*   (2006.01)
*G11C 5/14*   (2006.01)

(52) U.S. Cl. ....................... 365/205; 365/207; 365/208; 365/203; 365/189.09; 365/189.11; 365/226

(58) Field of Classification Search ............ 365/189.09, 365/189.11, 203, 205, 207, 208, 226
See application file for complete search history.

(56) References Cited

U.S. PATENT DOCUMENTS

| | | | |
|---|---|---|---|
| 6,819,613 B2 | 11/2004 | Takemura et al. | |
| 6,928,006 B2 * | 8/2005 | Park | 365/189.11 |
| 6,996,023 B2 * | 2/2006 | Kim | 365/226 |
| 7,012,840 B2 * | 3/2006 | Kang | 365/189.09 |
| 7,042,781 B2 * | 5/2006 | Kim | 365/205 |
| 7,184,342 B2 * | 2/2007 | Seo | 365/205 |
| 7,196,965 B2 * | 3/2007 | Han et al. | 365/230.06 |
| 7,298,660 B2 * | 11/2007 | Byun | 365/205 |
| 2006/0245284 A1 * | 11/2006 | Do | 365/207 |

FOREIGN PATENT DOCUMENTS

| | | |
|---|---|---|
| JP | 09-204777 | 8/1997 |
| KR | 10-2002-0034215 | 5/2002 |
| KR | 10-2002-0057280 | 7/2002 |
| KR | 10-2003-0050960 | 6/2003 |
| KR | 10-2003-0057702 | 7/2003 |

* cited by examiner

*Primary Examiner*—Trong Phan
(74) *Attorney, Agent, or Firm*—John P. White; Cooper & Dunham LLP

(57) ABSTRACT

A sense amplifier control circuit which can be used in a semiconductor device includes an enable signal generator for decoding a plurality of internal commands, to output a first enable signal and a second enable signal which are enabled in an active mode of a semiconductor device, a first driving control signal generator for generating a first driving control signal adapted to control a driving period of a pull-down source line of a sense amplifier included in the semiconductor device, a second driving control signal generator for comparing a voltage level of a pull-up source line of the sense amplifier with a predetermined internal voltage, and generating a second driving control signal which is enabled when the voltage level of the pull-up source line is higher than the internal voltage, to control the driving period of the pull-up source line, and a third driving control signal generator for generating a third driving control signal which is disabled in response to enabling of the second driving control signal, to control an over-driving period of the pull-up source line.

15 Claims, 3 Drawing Sheets

SENSE AMPLIFIER CONTROL CIRCUIT AND SEMICONDUCTOR DEVICE USING THE SAME

TECHNICAL FIELD

The present disclosure relates to a sense amplifier control circuit and a semiconductor device using the same, and, more particularly, to a sense amplifier control circuit which optimizes the over-driving period of a sense amplifier, to maintain the voltage on a pull-up source line of the sense amplifier in an appropriate range, and a semiconductor device using the sense amplifier control circuit.

DESCRIPTION OF THE RELATED ART

Semiconductor memory devices, which are used for storage of information, have been advanced toward low costs, miniaturization, and large capacity, in accordance with the technical advances in computer system and electronic communication fields. Also, the developments of such semiconductor memory devices have been advanced toward inhibition of unnecessary current consumption because of an increased demand for enhanced energy efficiency.

Generally, the cell array of a DRAM device to store data includes a number of cells each of which includes one NMOS transistor and one capacitor and which are connected to word lines and bit lines connected in the form of a net.

Hereinafter, operation of such a general DRAM device will be described in brief.

When a row address strobe (RAS) signal /RAS, which is a main signal to activate the DRAM device, transits to an active state (low-level state), address signals are input to a row address buffer. In this state, a row decoding operation is carried out to decode row address signals output from the row address buffer, and thus, to output a row address for selecting one of the word lines in the cell array.

When data of each cell connected to the selected word line is applied to a pair of bit lines, namely, a bit line BL and a complementary bit line /BL, connected to the cell, a sense amplifier enable signal informing of the point of time when a sense amplifier should operate is enabled. As a result, a sense amplifier driving circuit for a cell block selected by the row address operates. In accordance with the operation of the sense amplifier driving circuit, bias potentials of a sense amplifier associated with the sense amplifier driving circuit are transited to a core potential Vcore and a ground potential Vss, respectively, so that the sense amplifier is driven. When the sense amplifier begins to operate, the potential difference between the bit lines BL and /BL, which has been kept minute, is amplified. Subsequently, in response to a column address, a column decoder turns on a column transfer transistor which serves to transfer the data on the bit line BL and the data on the bit line /BL to data bus lines LDATA and /LDATA, respectively. Accordingly, the data transferred to the bit line BL and the data transferred to the bit line /BL are sent to the data bus lines LDATA and /LDATA, respectively. Thus, the data is output to the outside of the DRAM device.

That is, in a semiconductor device of FIG. 1, before the semiconductor memory device operates, namely, in the standby mode, a control signal /BLEQ is in a high level state, namely, an enable state, so that NMOS transistors N24, N25, N17, and N28 are in an ON state. Accordingly, the bit lines BL and /BL of each bit line pair is in a state of being precharged with a voltage VBLP having a voltage level of ½ Vcore. When the control signal /BLEQ is transited to a low level as the semiconductor device subsequently enters an active mode, data of memory cells is sent to the bit lines BL and /BL. As a result, the potentials of the bit lines BL and /BL are varied to have a minute difference. When a sense amplifier 100 begins to operate as power is supplied to a pull-up source line CSP and a pull-down source line CSN of the sense amplifier 100 in the above state, the potentials of the bit lines BL and /BL, the difference of which is minute, are varied to a core potential Vcore and a ground potential Vss, respectively. Namely, amplification of the data on the bit lines BL and /BL is carried out. The amplified data from the bit line BL and the amplified data from the bit line /BL are sent to the data bus lines LDATA and /LDATA when NMOS transistors N20 and N21 are turned on, respectively, in accordance with a column decoder output signal Yi.

In the above-mentioned conventional semiconductor memory device, however, a large amount of current is abruptly consumed at the point of time when the sense amplifier begins to operate in accordance with reception of the internal voltage, namely, a core voltage, VCORE. As a result, there is a problem in that the voltage level of the pull-up source line CSP is abruptly dropped. In order to solve this problem, a scheme, in which an external supply voltage VDD is supplied to the pull-up source line CSP of the sense amplifier 100 when the active mode is begun, in particular, at the point of time when the sense amplifier begins to operate, has been widely used. This method is referred to as "sense amplifier over-driving". When such a sense amplifier over-driving scheme is applied to the above-mentioned conventional semiconductor memory device, the pull-down source line CSN of the sense amplifier 100 is driven to a ground voltage level VSS via an NMOS transistor N14 which is turned on by a driving control signal SAN when the active mode is begun. Also, the pull-up source line CSP of the sense amplifier 100 is over-driven to the level of the external supply voltage VDD via an NMOS transistor N15 driven in accordance with a driving control signal SAP1, for a predetermined period. When the predetermined period elapses, the pull-up source line CSP is driven to the level of the internal voltage VCORE via an NMOS transistor N16 driven in accordance with a driving control signal SAP2.

In conventional cases, however, the over-driving operation for the pull-up source line CSP of the sense amplifier 100 is carried out for the predetermined period, irrespective of the actual voltage level of the pull-up source line CSP. For this reason, a reverse current path from the pull-up source line CSP to the voltage supply terminal for the internal voltage VCORE may be established due to an excessive increase in the voltage of the pull-up source line CSP. Otherwise, erroneous data sensing may occur due to an excessive drop in the voltage of the pull-up source line CSP caused by insufficient over-driving.

That is, in conventional cases, a pulse generator, which includes a delay having a certain delay period, is used in order to generate the driving control signal SAP1 for over-driving the pull-up source line CSP and the driving control signal SAP2 for driving the pull-up source line CSP to the level of the internal voltage VCORE after the over-driving operation. For this reason, the driving control signal SP1 has a constant enable period, irrespective of the voltage level of the pull-up source line CSP of the sense amplifier 100. The driving control signal SP2 is also configured to transit to a high level, namely, an enable state, when the driving control signal SAP1 transits to a low level, namely, a disable state.

As a result, when the enable period of the driving control signal SAP1 having the above-mentioned waveform is longer than an appropriate period, the voltage level of the pull-up source line CSP is excessively increased over the internal voltage VCORE. In this case, there is a problem in that a reverse current path from the pull-up source line CSP to the voltage supply terminal for the internal voltage VCORE is established when the NMOS transistor N16 is turned on as the driving control signal SAP2 is subsequently enabled. On the other hand, when the enable period of the driving control signal SAP1 having the above-mentioned waveform is shorter than the appropriate period, the voltage level of the pull-up source line CSP cannot be maintained at an appropriate level, namely, the level of the internal voltage VCORE, because the NMOS transistor N16 is subsequently turned on under the condition in which the voltage level of the pull-up source line CSP is excessively lower than the internal voltage VCORE. In this case, there is a problem in that erroneous data sensing may occur during a data read or write operation.

SUMMARY

Therefore, the present disclosure provides a sense amplifier control circuit which can optimize the over-driving period of a sense amplifier, to maintain the voltage on a pull-up source line of the sense amplifier in an appropriate range, and can prevent establishment of a reverse current path to an internal voltage supply terminal caused by an excessive increase in the voltage of the pull-up source line, and can prevent occurrence of erroneous data sensing caused by an excessive voltage drop of the pull-up source line, and provides a semiconductor device using the sense amplifier control circuit.

In accordance with one aspect of this disclosure, a sense amplifier control circuit is provided which comprises an enable signal generator for receiving a plurality of internal commands, and decoding the received commands, to output a first enable signal and a second enable signal which are enabled in an active mode of a semiconductor device using the sense amplifier control circuit, a first driving control signal generator for receiving the first enable signal, and generating a first driving control signal adapted to control a driving period of a pull-down source line of a sense amplifier included in the semiconductor device, a second driving control signal generator for comparing a voltage level of a pull-up source line of the sense amplifier with a predetermined internal voltage, and generating a second driving control signal which is enabled when the voltage level of the pull-up source line is higher than the internal voltage, to control the driving period of the pull-up source line, and a third driving control signal generator for receiving the second enable signal and the second driving control signal, and generating a third driving control signal which is disabled in response to enabling of the second driving control signal, to control an over-driving period of the pull-up source line.

In accordance with another aspect of the present disclosure, a semiconductor device using a sense amplifier over-driving scheme is provided which includes a sense amplifier for amplifying data of a memory cell, a sense amplifier source line driving unit including a first driver for pulling down a pull-down source line of the sense amplifier, a second driver for pulling up a pull-up source line of the sense amplifier, and a third driver for over-driving the pull-up source line to a predetermined level, and a sense amplifier control circuit for generating first to third control signals adapted to control operations of the first to third drivers, respectively. The sense amplifier control circuit includes an enable signal generator for receiving a plurality of internal commands, and decoding the received commands, to output a first enable signal and a second enable signal which are enabled in an active mode of the semiconductor device, a first driving control signal generator for receiving the first enable signal, and generating a first driving control signal adapted to control a driving period of the first driver, a second driving control signal generator for comparing a voltage level of a pull-up source line of the sense amplifier with a predetermined internal voltage, and generating a second driving control signal which is enabled when the voltage level of the pull-up source line is higher than the internal voltage, to control a driving period of the second driver, and a third driving control signal generator for receiving the second enable signal and the second driving control signal, and generating a third driving control signal which is disabled in response to enabling of the second driving control signal, to control a driving period of the third driver.

The pull-down source line may be driven to a ground voltage in a driving period controlled by the first driving control signal. The pull-up source line may be driven by an external supply voltage for the over-driving period, and may be driven by the internal voltage for a driving period controlled by the second driving control signal.

The first driving control signal generator may operate in response to at least one block select signal.

The first driving control signal generator may comprise a first logic unit for performing a logical operation of the at least one block select signal, and outputting a result of the logical operation, a second logic unit for performing a logical operation of the first enable signal and an output signal from the first logic unit, and outputting a result of the logical operation, and a level shifter for shifting a voltage level of an output signal from the second logic unit.

The first driving control signal generator may further comprise a first buffer for buffering the first enable signal, and outputting the buffered signal to the second logic unit, and a second buffer for buffering an output signal from the level shifter.

Each of the first and second logic units may perform a NAND operation.

The level shifter may shift the output signal of the second logic unit from a level of an external supply voltage to a level of a high voltage.

The second driving control signal generator may comprise a comparator for comparing the voltage level of the pull-up source line with a level of the internal voltage, and outputting a result of the comparison, and a buffer for buffering an output signal from the comparator.

The comparator may comprise a first pull-down device arranged between a first node and a second node, to pull down the second node in response to a voltage on the pull-up source line, a second pull-down device arranged between the first node and a third node, to pull down the third node in response to the internal voltage, a first switch arranged between the first node and a ground terminal, to operate in response to a predetermined control signal, a first pull-up device arranged between a high-voltage supply terminal and the second node, to pull up the second node in response to a signal from the third node, and a second pull-up device arranged between the high-voltage supply terminal and the third node, to pull up the third node in response to the signal from the third node.

The third driving control signal generator may operate in response to at least one block select signal.

The third driving control signal generator may comprise a first logic unit for performing a logical operation of the at least one block select signal, and outputting a result of the logical operation, a second logic unit for performing a logical operation of the second enable signal and an output signal from the first logic unit, and outputting a result of the logical operation, a level shifter for shifting a voltage level of an output signal from the second logic unit, a first buffer for buffering an output signal from the level shifter, and a signal output unit for receiving an output signal from the first buffer, and outputting the received signal, as the third driving control signal, in response to the second driving control signal.

The signal output unit may comprise a second buffer for buffering the second driving control signal, and a third logic unit for logically operating the output signal from the first buffer and an output signal from the second buffer.

The third logic unit may perform a NAND operation.

Each of the first and second logic units may perform a NAND operation.

The level shifter may shift the output signal of the second logic unit from a level of an external supply voltage to a level of a high voltage.

The enable signal generator may comprise a command decoder for receiving the plurality of internal commands, and decoding the received internal commands, a first delay for delaying a first output signal from the command decoder for a predetermined period, and outputting the delayed signal, as the first enable signal, and a second delay for delaying a second output signal from the command decoder for a predetermined period, and outputting the delayed signal, as the second enable signal.

The internal voltage may be a core voltage which is used as a source voltage for a core region in the semiconductor memory device.

BRIEF DESCRIPTION OF THE DRAWINGS

The above features and advantages of the subject matter of the present disclosure will become more apparent after reading the following detailed description when taken in conjunction with the drawings, in which.

DESCRIPTION OF THE PREFERRED EMBODIMENTS

Hereinafter, the subject matter of the present disclosure will be described in detail, in conjunction with exemplary, preferred embodiments. In describing the exemplary embodiments for illustrative purposes, specific technology is employed for the sake of clarity. However, the present disclosure is not intended to be limited to the specific terminology so selected and it is to be understood that each specific element includes all technical equivalents that operate in a similar manner.

Figure 2:
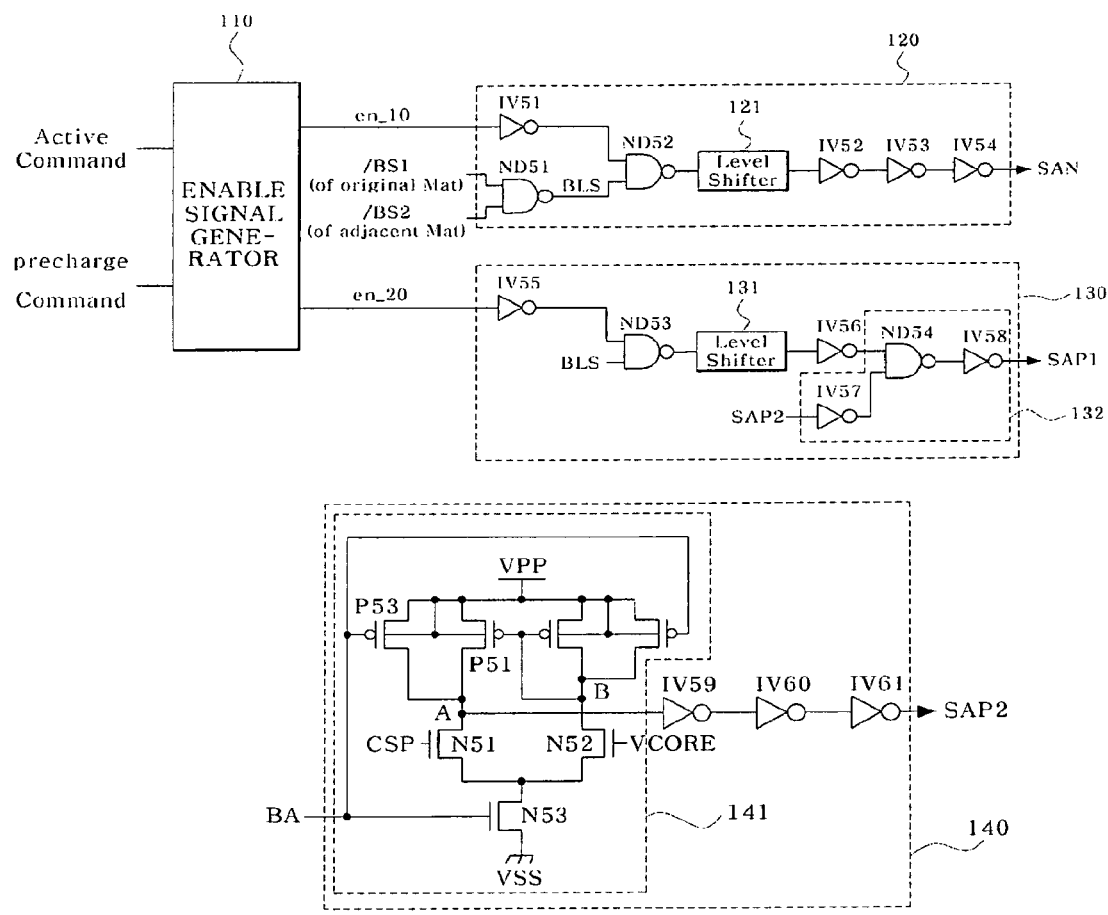
FIG. 2 shows a circuit diagram illustrating a configuration of a sense amplifier control circuit according to an exemplary embodiment of the present disclosure.
Figure 3:
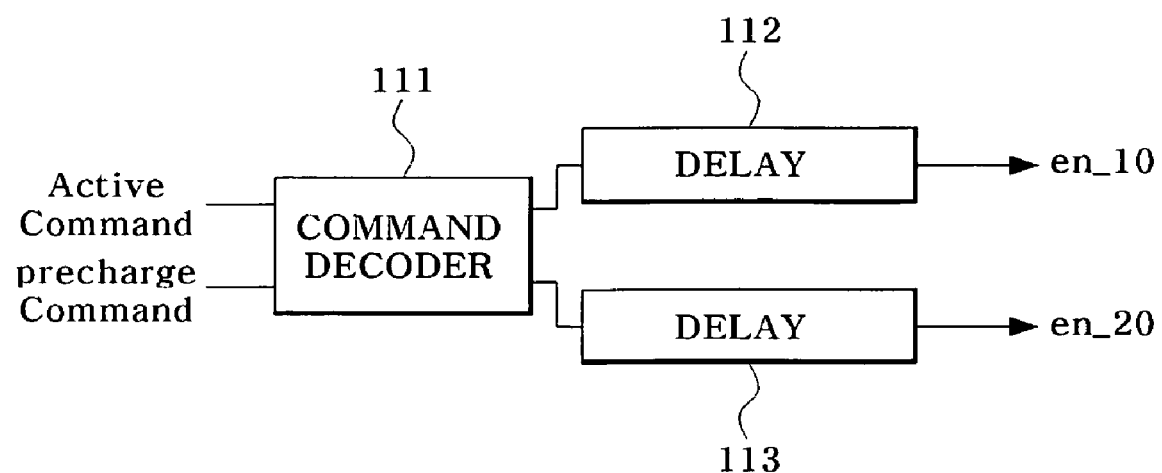
FIG. 3 shows a circuit diagram illustrating a configuration of an enable signal generator included in the sense amplifier control circuit shown in FIG. 2.

FIG. 2 illustrates a configuration of a sense amplifier control circuit according to an exemplary embodiment of the present disclosure. FIG. 3 illustrates a configuration of an enable signal generator included in the sense amplifier control circuit shown in FIG. 2. The illustrated embodiment will be described hereinafter with reference to the drawings.

As shown in FIG. 2, the sense amplifier control circuit according to the illustrated embodiment includes an enable signal generator 110 for receiving a plurality of internal commands (for example, an active command and a precharge command), and decoding the received commands, to output enable signals en_10 and en_20, which are enabled in an active mode of a semiconductor device using the sense amplifier control circuit. The sense amplifier control circuit also includes a first driving control signal generator 120 for receiving the enable signal en_10, and generating a driving control signal SAN adapted to control the driving period of a pull-down source line CSN of the sense amplifier 100, a second driving control signal generator 140 for comparing the voltage level of the pull-up source line CSP of the sense amplifier 100 with a predetermined internal voltage VCORE, and generating a driving control signal SAP2, which is enabled when the voltage level of the pull-up source line CSP is higher than the internal voltage VCORE, to control the driving period of the pull-up source line CSP, and a third driving control signal generator 130 for receiving the enable signal en_20 and the driving control signal SAP2, and generating a driving control signal SAP1, which is disabled in response to enabling of the driving control signal SAP2, to control the over-driving period of the pull-up source line CSP.

Operation of the sense amplifier control circuit having the above-described configuration according to the illustrated embodiment and operation of the semiconductor device using the sense amplifier control circuit will be described in detail with reference to FIGS. 1 to 3.

Figure 1:
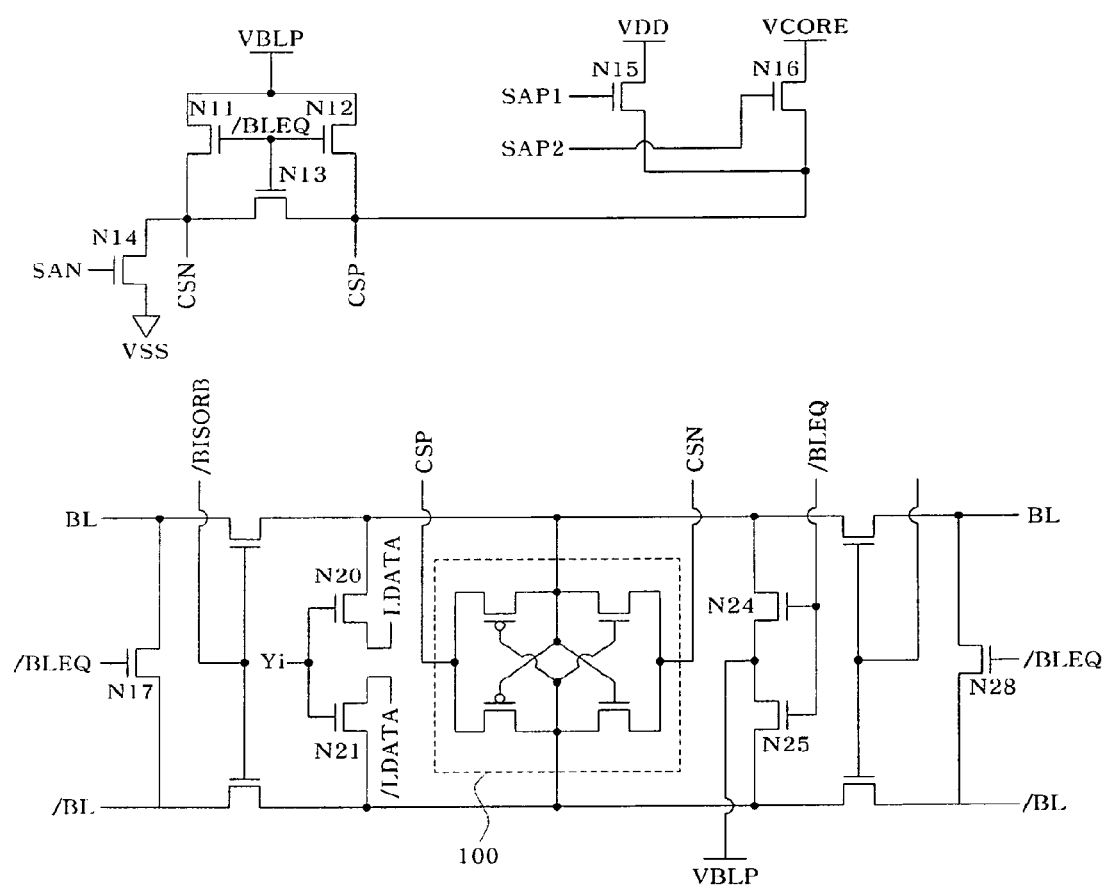
FIG. 1 shows a circuit diagram illustrating a configuration of a semiconductor device using an over-driving scheme.

When the semiconductor device of FIG. 1 is in a precharge mode, the control signal /BLEQ is in a high level state (namely, an enable state), so that the NMOS transistors N24, N25, N17, and N28 are in an ON state. Accordingly, the bit lines BL and /BL of each bit line pair is in a state of being precharged with a voltage VBLP having a voltage level of ½ Vcore. In this state, the enable signal generator 110 of FIG. 2 generates the enable signals en_10 and en_20 which are in a high level state (namely, a disable state). That is, in the enable signal generator 110 of FIG. 3, a plurality of commands (for example, an active command and a precharge command) are input to a command decoder 111. The command decoder 111 decodes the received commands, generates the enable signals en_10 and en_20 which transit to a high level state (namely, a disable state) in a precharge mode, and transits to a low level state (namely, an enable state) in an active mode. The enable signals en_10 and en_20 are output through delays 112 and 113, respectively. The command decoder 111 has the same basic configuration and operation as command decoders used in conventional semiconductor devices in that it decodes a plurality of command signals, and generates a plurality of enable signals enabled or disabled in accordance with the operation mode of a semiconductor device.

In the precharge mode, the enable signal en_10 is in a high level state. In the first driving control signal generator 120, which receives the enable signal en_10, a NAND gate ND52 receives a low-level signal from an inverter IV51, and outputs a high-level signal. The level of the output signal from the NAND gate ND52 is shifted by a level shifter 121 from the level of an external supply voltage VDD to the level of a high voltage VPP. An output signal from the level shifter 121 is output as the driving control signal SAN after passing through inverters IV52, IV53, and IV54. Accordingly, the driving control signal SAN output from the first driving control signal generator 120 has a low level. As a result, the NMOS transistor N14, which is a driver for driving the pull-down source line CSN of the sense amplifier in the configuration of FIG. 1, is turned off.

Similarly, in the third driving control signal generator 130, which receives the enable signal en_20, a NAND gate ND53 outputs a high-level signal in the precharge mode because the enable signal en_20 has a high level in the precharge mode. The level of the output signal from the NAND gate ND53 is shifted by a level shifter 131 from the level of the external supply voltage VDD to the level of the high voltage VPP. An output signal from the level shifter 131 is output as the driving control signal SAP1 after passing through an inverter IV56, a NAND gate ND54, and an inverter IV58. Accordingly, the driving control signal SAP1 output from the third driving control signal generator 130 has a low level. As a result, the NMOS transistor N15, which is a driver for over-driving the pull-up source line CSP of the sense amplifier in the configuration of FIG. 1, is turned off.

On the other hand, in the second driving control signal generator 140, which receives a bank active signal BA, an NMOS transistor N53 is turned off, and a PMOS transistor P53 is turned on in the precharge mode, because the bank active signal BA is in a low level state (namely, a disable state), in the precharge mode. Accordingly, a comparator 141 is disabled, and a node A is in a high level state. As a result, the driving control signal SAP2 output from the second driving control signal generator 140 has a low level in accordance with inversion operations of inverters IV59 to IV61. Thus, the NMOS transistor N16, which is a driver for driving the pull-up source line CSP of the sense amplifier in the configuration of FIG. 1, is turned off. In place of the bank active signal BA, a precharge signal, which is enabled in the precharge mode, may be used.

Meanwhile, in the configuration of FIG. 1, NMOS transistors N11, N12, and N13 are turned on in the precharge mode because the control signal /BLEQ has a high level. Accordingly, the pull-down source line CSN and pull-up source line CSP are precharged with the voltage VBLP.

When the control signal /BLEQ is transited to a low level as the semiconductor device subsequently enters the active mode, the NMOS transistors N24, N25, N17, and N28 of FIG. 1 are turned off, thereby causing the bit line BL and complementary bit line /BL to be isolated from each other. When data of memory cells is supplied to the bit lines BL and /BL, the potentials of the bit lines BL and /BL are varied to have a minute difference. In this case, the NMOS transistors N11, N12, and N13 are also turned off, thereby causing the pull-down source line CSN and pull-up source line CSP of the sense amplifier 100 to be isolated from each other.

When the active mode is begun, the enable signals en_10 and en_20 output from the enable signal generator 110 are transited to a low level state (namely, an enable state). That is, in the enable signal generator 110 of FIG. 3, the command decoder 111 receives a plurality of commands (for example, an active command and a precharge command), decodes the received commands, and generates the enable signals en_10 and en_20 which are transited from a high level state to a low level state (namely, an enable state), when the active mode is begun. The enable signals en_10 and en_20 are output from the command decoder 111 via the delays 112 and 113, respectively.

Since the enable signal en_10 has a low level (namely, is enabled), the NAND gate ND52 in the sense amplifier control circuit of FIG. 2 receives, at one input terminal thereof, a high-level signal from the inverter IV51. If any one of a block select signal /BS1 for a cell block associated with the sense amplifier (referred to as "original Mat" in FIG. 2) and a block select signal /BS2 for a cell block adjacent to the associated cell block (referred to as "adjacent Mat" in FIG. 2) transits to a low level state (namely, an enable state), the output signal from the NAND gate ND51 (namely, a control signal BLS) has a high level. Accordingly, the NAND gate ND52 NANDs the two high-level signals received from the inverter IV51 and NAND gate ND51, respectively, and thus, outputs a low-level signal. As a result, the driving control signal SAN output via the level shifter 121 and inverters IV52 to IV54 is transited from a low level to a high level, so that it is enabled. Thus, in the configuration of FIG. 1, the NMOS transistor N14 is turned on in response to the high-level driving control signal SAN, thereby driving the pull-down source line CSN of the sense amplifier 10 to the ground voltage level VSS.

Meanwhile, since the enable signal en_20 is also transited from a high level to a low level (namely, is enabled), the NAND gate ND53 in the sense amplifier control circuit of FIG. 2 receives, at one input terminal thereof, a high-level signal from an inverter IV55. Similar to the above case, if any one of the block select signal /BS1 for the cell block associated with the sense amplifier and the block select signal /BS2 for the cell block adjacent to the associated cell block transits to a low level state (namely, an enable state), the control signal BLS has a high level. Accordingly, the NAND gate ND53 NANDs an output signal from the inverter IV55 and the control signal BLS, and outputs a low-level signal. As a result, the inverter IV56 outputs a signal transited from a low level to a high level.

Meanwhile, the driving control signal SAP1 output from a signal output unit 132 is in a high level state (namely, an enable state), in an initial stage of the active mode, because the driving control signal SAP2 is in a low level state in the initial stage of the active mode, as will be described hereinafter. That is, since the bank active signal BA transits to a high level (namely, an enable state), when the active mode is begun, the comparator 141 in the second driving control signal generator 140 is enabled. Accordingly, the second driving control signal generator 140 compares the voltage on the pull-up source line CSP of the sense amplifier with the internal voltage VCORE, and generates the driving control signal SAP2 based on the result of the comparison. However, in an initial stage of the semiconductor device entering the active mode, the NMOS transistor N51 is strongly turned on, as compared to the NMOS transistor N52, because the voltage level of the pull-up source line CSP is lower than the internal voltage VCORE in the initial stage of the active mode. As a result, the PMOS transistor P51 is turned on, so that the potential of the node A is transited to a high level, thereby causing the driving control signal SAP2 to transit to a low level. In the third driving control signal generator 130, accordingly, the driving control signal SAP2 input to the signal output unit 132 is transited to a low level, so that the driving control signal SAP1 output from the signal output unit 132 is transited to a high level (namely, is enabled), as described above. Thus, in the configuration of FIG. 1, the NMOS transistor N15 is turned on in response to the high-level driving control signal SAP1, thereby over-driving the pull-up source line CSP of the sense amplifier 100 to the level of the external supply voltage VDD.

When the voltage level of the pull-up source line CSP of the sense amplifier 100 is increased over the internal voltage VCORE in accordance with the over-driving operation, the driving control signal SAP2 is transited from a low level to a high level. That is, when the voltage level of the pull-up source line CSP is higher than the internal voltage VCORE, the NMOS transistor N52 in the comparator 141 of the second driving control signal generator 140 is strongly turned on, as compared to the NMOS transistor N51. As a result, when the potentials of the nodes A and B are compared to each other, the node A has a low-level potential, whereas the node B has a high-level potential. Accordingly, the driving control signal SAP2 is transited to a high level.

Since the driving control signal SAP2 input to the signal output unit 132 of the third driving control signal generator 130 has a high level, and the output signal from the inverter IV57 has a low level, as described above, the driving control signal SAP1 output from the signal output unit 132 has a low level (namely, is disabled). As a result, in the configuration of FIG. 1, the NMOS transistor N15 is turned off in response to the low-level driving control signal SAP1, so that the over-driving operation for the pull-up source line CSP is stopped. On the other hand, the NMOS transistor N16 is turned on in response to the high-level driving control signal SAP2, thereby driving the pull-up source line CSP of the sense amplifier 100 to the level of the internal voltage VCORE.

As described above, in the sense amplifier control circuit according to the illustrated embodiment and the semiconductor device using the sense amplifier control circuit, the pull-up source line CSP of the sense amplifier 100 is over-driven to the level of the external supply voltage VDD when the active mode is begun. When it is subsequently sensed that the voltage level of the pull-up source line CSP is increased over the internal voltage VCORE in accordance with the over-driving operation, the driving control signal SAP1, which is an over-driving control signal, is disabled, to complete the over-driving operation. At the same time, the driving control signal SAP2 is enabled, to enable the pull-up source line CSP to be driven by the internal voltage VCORE. Thus, in accordance with the illustrated embodiment, the enable period of the driving control signal SAP1 determining the over-driving period for the pull-up source line CSP of the sense amplifier 100 is optimized based on the voltage level of the pull-up source line CSP. Accordingly, it is possible to maintain the voltage on the pull-up source line CSP of the sense amplifier 100 in an appropriate range. In accordance with the illustrated embodiment, therefore, it is possible to prevent establishment of a reverse current path from the pull-up source line CSP to the terminal for supplying the internal voltage VCORE caused by an excessive increase in the voltage of the pull-up source line CSP, and to prevent occurrence of erroneous data sensing caused by an excessive voltage drop of the pull-up source line CSP.

Meanwhile, since a voltage is supplied to each of the pull-up source line CSP and pull-down source line CSN of the sense amplifier 100, as described above, the sense amplifier 100 can perform a sensing operation for cell data. That is, the potentials of the bit lines BL and /BL, the difference of which is minute, are varied to a core potential Vcore and a ground potential Vss, respectively. Namely, amplification of the data on the bit lines BL and /BL is carried out. The amplified data from the bit line BL and the amplified data from the bit line /BL are sent to the data bus lines LDATA and /LDATA when NMOS transistors N20 and N21, are respectively, are turned on in accordance with a column decoder output signal Yi.

As apparent from the above description, the present disclosure provides a sense amplifier control circuit and a semiconductor device using the same, which can optimize the over-driving period of a sense amplifier, to maintain the voltage on a pull-up source line of the sense amplifier in an appropriate range, and can prevent establishment of a reverse current path from the pull-up source line to an internal voltage supply terminal caused by an excessive increase in the voltage of the pull-up source line, and prevent occurrence of erroneous data sensing caused by an excessive voltage drop of the pull-up source line.

Although the preferred embodiments of the present disclosure have been disclosed for illustrative purposes, those skilled in the art will appreciate that various modifications, additions and substitutions are possible, without departing from the scope and spirit of this disclosure and the accompanying claims.

This application is based on Korean Patent Application No. 2006-16436 filed on Feb. 20, 2006, the entire contents of which are incorporated by reference herein.

What is claimed is:

1. A sense amplifier control circuit comprising:
   an enable signal generator configured to decode an active command and a pre-charge command, and generate a first enable signal and a second enable signal which are enabled when the active command is enabled;
   a first driving control signal generator configured to receive the first enable signal, and generate a first driving control signal which is enabled to drive a pull-down source line connected to a sense amplifier into a level of a ground voltage;
   a second driving control signal generator configured to compare a level of a pull-up source line connected to the sense amplifier with a level of an internal voltage, and generate a second driving control signal, the second driving control signal being enabled when the level of the pull-up source line is higher than the level of the internal voltage and being enabled to drive the pull-up source line into the level of the internal voltage; and
   a third driving control signal generator configured to receive the second enable signal and the second driving control signal, and generate a third driving control signal, the third driving control signal being enabled to drive the pull-up source line into the level of an external voltage and being disabled when the first driving control signal is enabled.

2. The sense amplifier control circuit according to claim 1, further comprising:
   a first driver configured to be a first transistor connected between the pull-up source line and the internal voltage and turned on for driving the pull-up source line into the level of the internal voltage in response to the first driving control signal; and
   a second driver configured to be a second transistor connected between the pull-up source line and the external voltage and turned on for driving the pull-up source line into the level of the external voltage in response to the second driving control signal.

3. The sense amplifier control circuit according to claim 1, wherein the first driving control signal generator comprises:
   a first logic unit configured to receive a first block select signal and a second block signal and perform a first logical operation to generate a first output signal;
   a second logic unit configured to receive the first output signal and an inverted signal of the first enable signal and perform a second logical operation to generate a second output signal; and
   a first level shifter configured to shift a level of the second output signal and generate a third output signal.

4. The sense amplifier control circuit according to claim 3, wherein the first driving control signal generator further comprises:
   a first buffer configured to receive the first enable signal and generate the inverted signal of the first enable signal; and
   a second buffer configured to receive and buffer the third output signal and generate the first driving control signal.

5. The sense amplifier control circuit according to claim 3, wherein each of the first and second logic units performs a NAND operation.

6. The sense amplifier control circuit according to claim 3, wherein the second output signal has a level of the external voltage and the third output signal has a level of high voltage.

7. The sense amplifier control circuit according to claim 1, wherein the second driving control signal generator comprises:

a comparator configured to compare the level of the pull-up source line with the level of the internal voltage, and generate a comparison signal; and a buffer configured to buffer the comparison signal, and generate the second driving control signal.

8. The sense amplifier control circuit according to claim 7, wherein the comparator comprises:

a first pull-down device being a first transistor connected between a first node and a second node and turned on for driving the second node in response to the level of the pull-up source line;

a second pull-down device being a second transistor connected between the first node and a third node, and turned on for driving the third node in response to the internal voltage;

a first switch being a third transistor connected between the first node and a ground voltage supply terminal, and turned on when a control signal is enabled;

a first pull-up device being a fourth transistor connected between a high-voltage supply terminal and the second node and turned on to drive the second node in response to a signal from the third node; and a second pull-up device being a fifth transistor connected between the high-voltage supply terminal and the third node and turned on to drive the third node in response to the signal from the third node.

9. The sense amplifier control circuit according to claim 3, wherein the third driving control signal generator comprises:

a third logic unit configured to receive the first output signal and an inverted signal of the second enable signal and perform a third logical operation to generate a fourth output signal;

a second level shifter configured to shift a level of the fourth output signal and generate a fifth output signal;

a first buffer configured to buffer the fifth output signal and generate a sixth output signal; and a signal output unit configured to receive the sixth output signal and generate the third driving control signal, in response to the second driving control signal.

10. The sense amplifier control circuit according to claim 9, wherein the signal output unit comprises:

a second buffer configured to buffer the second driving control signal and generate a seventh output signal; and a fourth logic unit configured to receive the sixth output signal and the seventh output signal and perform a fourth logical operation to generate the third driving control signal.

11. The sense amplifier control circuit according to claim 10, wherein the fourth logic unit performs a NAND operation.

12. The sense amplifier control circuit according to claim 9, wherein the third logic unit performs a NAND operation.

13. The sense amplifier control circuit according to claim 9, wherein the fourth output signal has a level of the external voltage and the fifth output signal has a level of high voltage.

14. The sense amplifier control circuit according to claim 1, wherein the enable signal generator comprises:

a command decoder configured to receive the active command and the pre-charge command, and decode the received active and pre-charge commands to generate a decoding signal;

a first delay configured to delay the decoding signal for a predetermined period, and generate the first enable signal; and a second delay configured to delay the decoding signal for a predetermined period, and generate the second enable signal.

15. The sense amplifier control circuit according to claim 1, wherein the internal voltage is a core voltage which is used for a core region in the semiconductor memory device.

* * * * *